(12) United States Patent
Yokoue et al.

(10) Patent No.: US 7,038,756 B2
(45) Date of Patent: May 2, 2006

(54) FIXING DEVICE, METHOD OF FIXING SUBSTRATE AND APPARATUS AND METHOD FOR MANUFACTURING A LIQUID CRYSTAL DISPLAY PANEL USING THE SAME

(75) Inventors: Toshiyuki Yokoue, Shiga-ken (JP); Shuhichi Odahara, Kanagawa-ken (JP); Kohichi Toriumi, Shiga-ken (JP); Hiroyuki Kamiya, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/061,068

(22) Filed: Feb. 18, 2005

(65) Prior Publication Data
US 2005/0190339 A1 Sep. 1, 2005

Related U.S. Application Data

(62) Division of application No. 10/319,030, filed on Dec. 13, 2002, now Pat. No. 6,879,370.

(30) Foreign Application Priority Data
Dec. 14, 2001 (JP) .............................. 2001-381008

(51) Int. Cl.
*G02F 1/13* (2006.01)
*G02F 1/1333* (2006.01)
*G02F 1/1339* (2006.01)

(52) U.S. Cl. ...................... 349/187; 349/153; 349/158; 349/189; 349/790

(58) Field of Classification Search ................ 349/187, 349/189, 190, 153, 158
See application file for complete search history.

(56) References Cited

U.S. PATENT DOCUMENTS

| 5,964,978 A * | 10/1999 | Hirooka ....................... 156/299 |
| 6,337,003 B1 * | 1/2002 | Kinokiri et al. ........ 204/298.15 |
| 6,337,730 B1 * | 1/2002 | Ozaki et al. ................ 349/156 |

* cited by examiner

*Primary Examiner*—Huyen Ngo
(74) *Attorney, Agent, or Firm*—William Gill; Dillon & Yudell LLP

(57) ABSTRACT

Disclosed are a fixing device and method of fixing substrate to provide holding means capable of surely fixing and positioning a sheet-like substrate even in vacuum, and to provide an operational mechanism thereof. A fixing device includes: a carrier plate for setting a glass substrate thereon; a claw for pressing the glass substrate set on the carrier plate, when the glass substrate is set thereon, by sandwiching the glass substrate from the periphery thereof; and an airbag having air sealed therein and expanding by lowering an external pressure. The claw is operated by using expansion of the airbag as power, thereby fixing the glass substrate.

2 Claims, 17 Drawing Sheets

FIG. 4
(d)
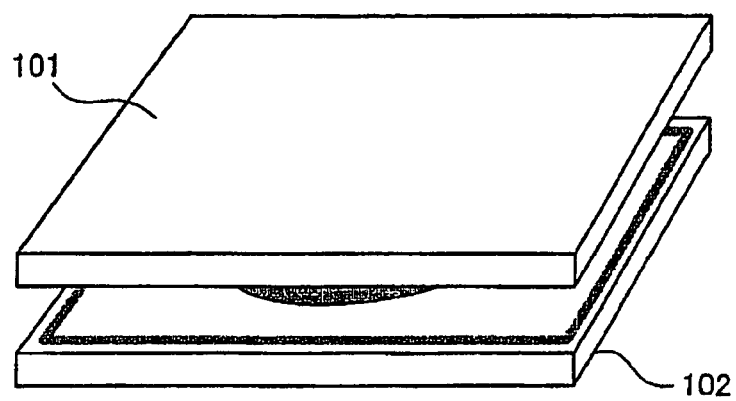
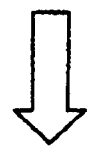
(e)
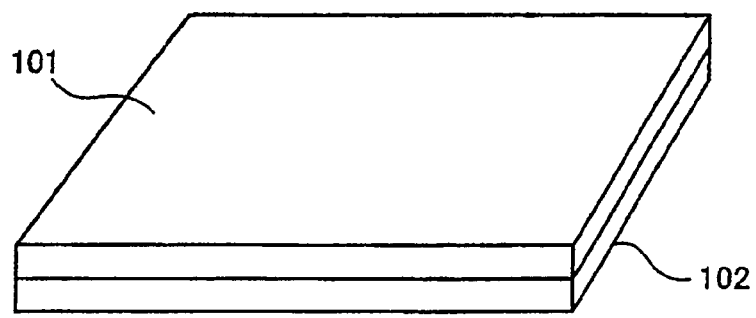

FIG. 5
(A)
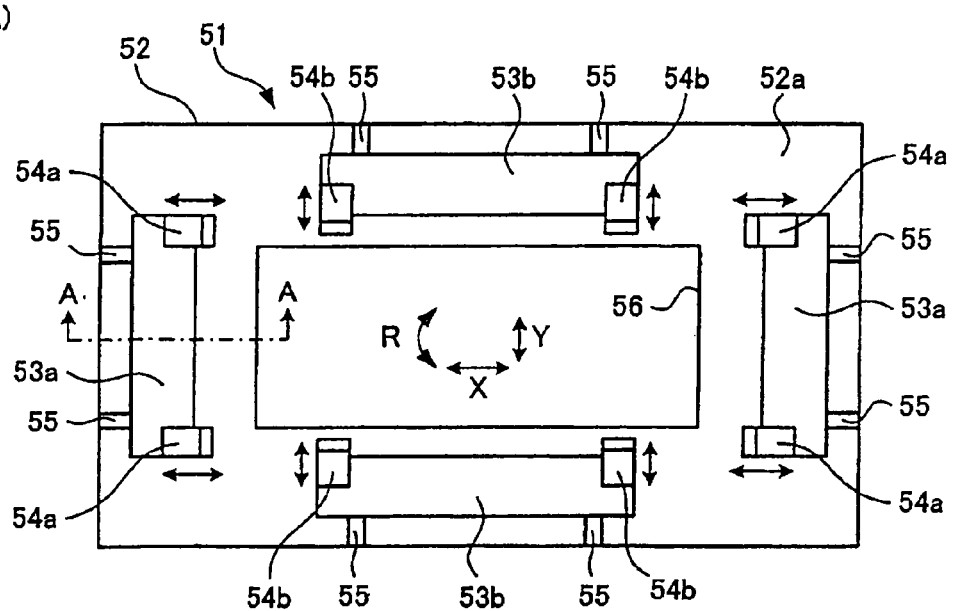
(B)
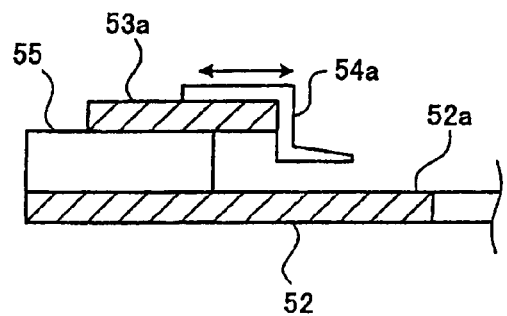

FIXING DEVICE, METHOD OF FIXING SUBSTRATE AND APPARATUS AND METHOD FOR MANUFACTURING A LIQUID CRYSTAL DISPLAY PANEL USING THE SAME

This application is a division of Ser. No. 10/319,030, filed Dec. 13, 2002, now U.S. Pat. No. 6,879,370.

This application claims the priority of Japanese Patent No. JP2001-381008 (IBM Docket No. JP920010284JP 1), filed on Dec. 14, 2001, and entitled "Fixing Device, Method of Fixing Substrate and Apparatus and Method for Manufacturing a Liquid Crystal Display Panel Using the Same".

BACKGROUND OF THE INVENTION

1. Technical Field

The present invention relates to a mechanism for fixing a position of a sheet-like substrate, and more particularly to a mechanism for fixing a position of a substrate as an object in an operation in vacuum.

2. Description of the Related Art

In recent years, a liquid crystal display device has become widely used as display means of a computer equipment and as a TV monitor. The liquid crystal display device has a liquid crystal display panel having liquid crystal sealed between a pair of glass substrates thereof, and shuts out light transmission through the glass substrates by changing alignment of liquid crystal molecules by voltage application to the liquid crystal, thereby plotting an image.

As a process mainly used for sealing the liquid crystal in the steps of manufacturing the liquid crystal display panel, there are methods called a vacuum injection method and a dropping method. The vacuum injection method is performed in the following manner. Specifically, a pair of glass substrates with a predetermined gap therebetween are disposed oppositely to each other, and a panel having a liquid crystal injection port is soaked in liquid crystal under vacuum after expelling air between the glass substrates. Thereafter, the pressure is returned to the atmospheric pressure, and thus the liquid crystal is injected into the panel by utilizing a pressure difference between the inside and outside of the panel and a capillary phenomenon. Meanwhile, the dropping method is performed as described below. Specifically, a sealing agent is applied in a frame shape to a periphery of one of a pair of glass substrates, liquid crystal is dropped onto a region surrounded by the sealing agent, and the other glass substrate is laminated onto the foregoing substrate. Thereafter, the sealing agent is hardened. The above-described dropping method is advantageous, compared with the vacuum injection method, in that time required for sealing the liquid crystal is significantly shortened. Therefore, in considering costs for manufacturing the liquid crystal display panel, the dropping method is an excellent manufacturing method.

In the above-described dropping method, upon lamination of the glass substrates, the glass substrates are desirably laminated in vacuum in order to avoid air bubbles remaining on a lamination plane. However, when the glass substrates are laminated in vacuum, there is a problem of how to hold the glass substrates in vacuum. In other words, in order to laminate the pair of glass substrates, it is necessary to fix and hold a position of at least one glass substrate and to perform positioning thereof with the other glass substrate. However, no appropriate means exists for holding the glass substrates.

Vacuum adsorption is one of the most commonly used methods of holding glass in the atmospheric pressure. However, in a vacuum state where a differential pressure is unobtainable, the vacuum adsorption cannot be used originally. In electrostatic adsorption using static electricity, adsorption in vacuum is possible. However, since electrical circuits are formed on the glass substrates of the liquid crystal panel, there is an accompanying risk of electrostatic discharge damage inflicted on these circuits due to the electrostatic adsorption.

According to a mechanical method of holding glass substrates, the glass substrates can be held in vacuum, and there never exists a problem such as the electrostatic discharge damage inflicted on the circuits. However, a mechanism itself is prone to become elaborate.

Since the gap between the pair of glass substrates constituting the liquid crystal display panel is as minute as 10 micrometers or less, the glass substrates are desirably fixed by a simpler mechanism in consideration of the followings: incapability of locking the substrates by hooking a plane for laminating the glass substrates with claws; and convenience in carrying the glass substrates in order to move to a step of hardening the sealing agent and the like after filling of the liquid crystal and lamination of the other glass substrate.

In addition, it is sufficient as long as a glass substrate, onto which the liquid crystal is dropped by the dropping method, is surely positioned on a support for setting this glass substrate. In this regard, it is not preferable that costs are increased because of provision of the mechanical holding means having the elaborate mechanism.

SUMMARY OF THE INVENTION

Consequently, an object of the present invention is to provide holding means capable of surely fixing and positioning a sheet-like substrate even in vacuum, and to provide an operational mechanism thereof.

Moreover, another object of the present invention is to provide an apparatus for manufacturing a liquid crystal display panel using such holding means and operational mechanism thereof.

The present invention for achieving the foregoing objects is realized as a fixing device for a substrate. The fixing device includes: a setting stage for setting a substrate thereon; an axis provided at a position on the setting stage so as to be along the periphery of the substrate in setting of the substrate on the setting stage; a claw abutting on the substrate, which is provided as freely rotatable around the axis; an arm for operating the claw by use of a lever taking the axis as a fulcrum; and an airbag, having air sealed therein, for operating the arm by expansion/contraction thereof. In response to the expansion/contraction of the airbag, the arm rotates the claw, and thus the substrate is fixed or released by the claw.

Here, the substrate corresponds to, for example, a glass substrate constituting a liquid crystal panel, a circuit board in a semiconductor device and the like. Therefore, the fixing device can be used for fixing the glass substrate or the circuit board in the steps of manufacturing the liquid crystal panel or the semiconductor device.

In addition, the arm herein can be constituted so as to protrude from the setting stage in a state of fixing the substrate by the claw. In this case, by pushing the protruding portion of the arm, the claw can be rotated in a direction opposite to that in the expansion of the airbag, and thus the fixation of the substrate can be released.

The airbag can also be expanded/contracted by changing an airbag surrounding a fixing device in a vacuum chamber. Moreover, the present invention is realized as a fixing device for fixing a substrate, which is constituted as follows. Specifically, the fixing device includes: a setting stage for setting a substrate thereon; a claw for pressing the substrate, when the substrate is set on the setting stage, by sandwiching the substrate from the periphery thereof; and an airbag having air sealed therein and expanding when an external pressure is lowered. The claw is operated by the expansion of the airbag as power, and thus the substrate is fixed or released.

The above fixing device can have a constitution including a lever as power transmitting means for operating the claw by the expansion of the airbag as the power. The lever includes: the axis as a fulcrum for supporting the claw as freely rotatable; and the arm for rotating the claw around the axis in response to the expansion of the airbag and for fixing or releasing the substrate.

Furthermore, the present invention is realized as a fixing device as follows, in which an object to be fixed is not limited to a substrate. Specifically, the fixing device includes: a claw which is provided around an axis as freely rotatable and abuts on the object to be fixed; an arm for operating the claw by a lever taking the axis as a fulcrum; and an airbag, in which air is sealed, for operating the arm by its expansion/contraction. In response to the expansion/contraction of the airbag, the arm rotates the claw, and thus the object to be fixed is fixed or released by the claw.

Alternatively, the present invention is realized as a fixing device as follows. Specifically, the fixing device includes: a claw abutting on an object to be fixed; and an airbag having air sealed therein. In response to expansion of the airbag, the claw and the object to be fixed are abutted on each other, thereby fixing the object to be fixed.

On the contrary, the fixation of the object to be fixed may be released by constituting the fixing device so as to allow the claw to press-contact with the object to be fixed in contraction of the airbag and by allowing the claw and the object to be fixed to come apart from each other in response to the expansion of the airbag.

In the above-described fixing devices, the airbag can be expanded by lowering a surrounding pressure or by increasing a volume of an internal pressure thereof upon application of heat.

Moreover, the present invention can be realized as a method of fixing a substrate for performing an operation with respect to the substrate in vacuum. Specifically, the method of fixing a substrate includes the steps of: setting the substrate on a setting stage having a claw which is opened/closed by using expansion/contraction of an airbag as power, the airbag having air sealed therein; expanding the airbag by reducing a surrounding pressure of the setting stage having the substrate set thereon; and fixing the substrate by closing the claw.

Here, to be more specific, the method may include the steps of: placing the setting stage in a vacuum chamber; reducing the surrounding pressure of the setting stage by evacuating the vacuum chamber; and expanding the airbag.

Furthermore, the present invention can be realized as an apparatus for manufacturing a liquid crystal display panel including a process of attaching glass substrates in vacuum. Specifically, in the apparatus for manufacturing a liquid crystal display device which has liquid crystal sealed between a pair of substrates disposed oppositely to each other with a predetermined gap, included are: a supporting device for supporting one of the pair of substrates; a setting stage for setting the other substrate; and a vacuum chamber for executing, in vacuum, an operation of attaching one of the substrates to the other thereof onto which the liquid crystal is dropped. The setting stage includes: an axis provided at a position on the setting stage along the periphery of the substrate in setting the substrate; a claw which is provided around the axis as freely rotatable and abuts on the periphery of the substrate from the side thereof; an arm for operating the claw by means of a lever taking the axis as a fulcrum; and an airbag provided so as to abut on the arm in its expansion, the airbag having air sealed therein. When the vacuum chamber is evacuated and the airbag is thereby expanded, the arm rotates the claw, and thus the claw fixes the substrate.

Alternatively, the present invention can be realized as an apparatus for manufacturing a liquid crystal display panel constituted as follows. Specifically, the apparatus includes: a supporting device for supporting one of a pair of substrates; a setting stage for setting the other substrate; and a vacuum chamber for executing, in vacuum, an operation of attaching one of the substrates to the other thereof onto which the liquid crystal is dropped. The setting stage includes: a claw for pressing the substrate, when the substrate is set on the setting stage, by sandwiching the substrate from the periphery thereof; an airbag expanding in response to lowering of an external pressure, the airbag having air sealed therein; and a lever for fixing the substrate by rotating the claw by the expansion of the airbag as power.

Similarly, the present invention is also realized as a method of manufacturing a liquid crystal display panel. Specifically, the method includes the steps of: setting one of substrates on a setting stage having a claw which is opened/closed by using expansion/contraction of an airbag as power, the airbag having air sealed therein; dropping liquid crystal on the substrate; expanding the airbag by evacuating air surrounding the setting stage on which the substrate is set and sandwiching the substrate from the periphery thereof by closing the claw, thereby fixing the substrate; superposing, under a vacuum environment, the other substrate out of a pair of substrates on the substrate onto which the liquid crystal is dropped and attaching the both substrates to each other.

BRIEF DESCRIPTION OF THE DRAWINGS

For a more complete understanding of the present invention and the advantages thereof, reference is now made to the following description taken in conjunction with the accompanying drawings.

FIGS. 4(d) and 4(e) are schematic views showing the steps of manufacturing the liquid crystal display panel.

FIGS. 5(a) and 5(b) are views showing a constitution of a glass substrate supporting device used in the steps of manufacturing the liquid crystal display panel.

DETAILED DESCRIPTION OF THE PRESENT INVENTION

Hereinbelow, a detailed description will be made for the present invention based on an embodiment shown in the accompanying drawings. In executing work in vacuum for sheet-like substrates as objects, a general-purpose use of the present invention as means for fixing the substrates is possible. However, in the embodiment described below, description will be made for a case, as an example, of using the present invention to fix the glass substrates upon lamination of a liquid crystal display panel in vacuum.

Figure 1:
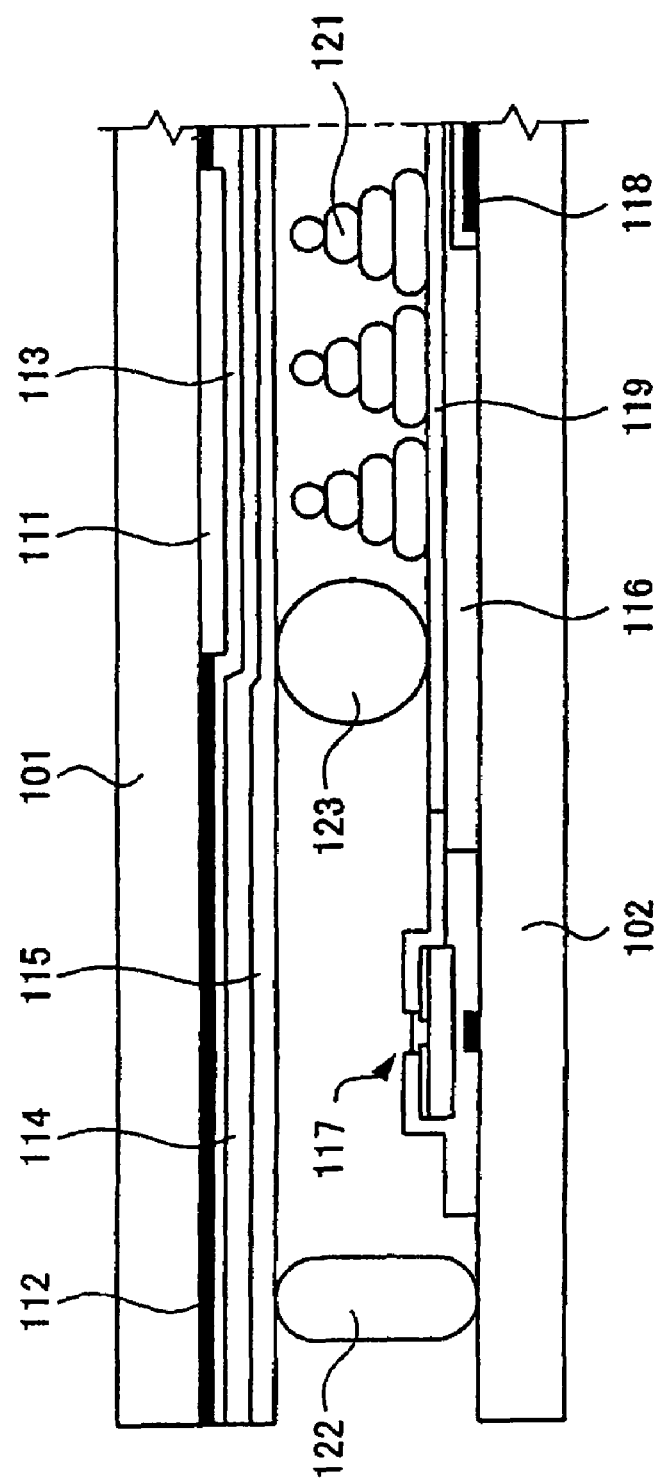
FIG. 1 is a sectional view of a liquid crystal display device.

FIG. 1 is a sectional view schematically showing a constitution of a liquid crystal display panel manufactured by a manufacturing apparatus using the embodiment. With reference to FIG. 1, in the liquid crystal display panel, a TFT 117 and a color filter 111 are laminated between a pair of glass substrates 101 and 102, the TFT 117 including formation of a source/drain electrode, a gate electrode, an amorphous silicon layer and the like. In addition, liquid crystal 121 is sealed between the substrates.

One of the pair of glass substrates 101 and 102 constitutes a color filter substrate; and the other thereof constitutes a TFT array substrate. In the example shown in FIG. 1, the glass substrate 101 is the color filter substrate, and the glass substrate 102 is the TFT array substrate. For such a glass substrate, for example, no-alkali glass with excellent flatness having a thickness of 0.7 mm is used.

The color filter substrate (the glass substrate 101) is constituted by sequentially laminating: the color filter 111 on a substrate surface, which is composed of a resin film containing dyes and pigments having three primary colors of red (R), green (G) and blue (B); a black matrix 112 as a light-shielding film, which is disposed between pixels of the color filter 111; a protective film 113 on the color filter 111 and the black matrix 112, which is composed of a resin film for protection thereof; a common electrode 114 on the protective film 113, which is composed of a transparent conductive thin film (for example, indium tim oxide: ITO); and a orientation film 115 on the common electrode 114, which is composed of a polyimide thin film and is for orienting the liquid crystal 121.

The TFT array substrate (the glass substrate 102) is constituted by forming: a display electrode 116 on a substrate surface, which is composed of a transparent conductive thin film (for example, indium tim oxide: ITO) for display and is to be a pixel; the TFT 117 as a switching element for driving the liquid crystal; a storage capacitor 118 as a signal retention capacitor for an active matrix operation; and an orientation film 119 composed of a polyimide thin film, which is for orienting the liquid crystal 121.

The pair of glass substrates 101 and 102 are adhered to each other on their peripheries by use of a sealing agent 122 as an adhesive. A region surrounded by the sealing agent 122 becomes an image display region.

In the image display region, disposed is a spacer 123 for controlling the gap between the glass substrates 101 and 102, in other words, a thickness of a liquid crystal layer (which is called as a cell gap). For the spacer 123, silica ($SiO_2$) and resin particles are used, for example. A cell gap of a color TFT liquid crystal display device is generally in the range of about 5 to 6 micrometer. Accordingly, a spacer having a size of about 5 to 6 micrometer in diameter is used. Recently, it has been conducted to form, by a thin film process, a column capable of functioning as the spacer between the glass substrates 101 and 102.

Now, with reference to FIGS. 2 to 4, description will be made for the outline of the steps of manufacturing the liquid crystal display panel described above. In the embodiment, the dropping method is used as the process for sealing the liquid crystal.

Figure 2:
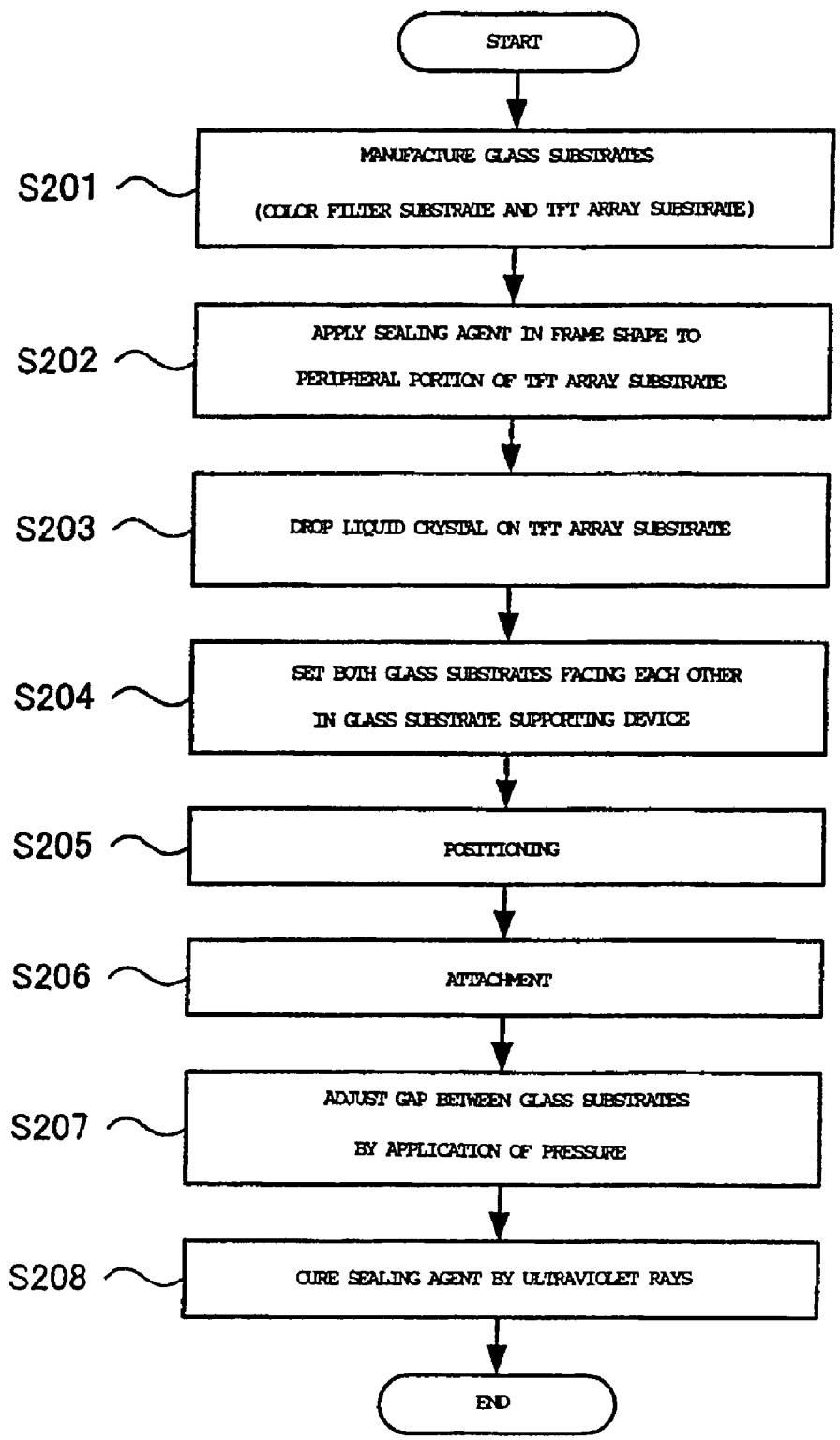
FIG. 2 is a flowchart illustrating the outline of the steps of manufacturing a liquid crystal display panel.
Figure 3:
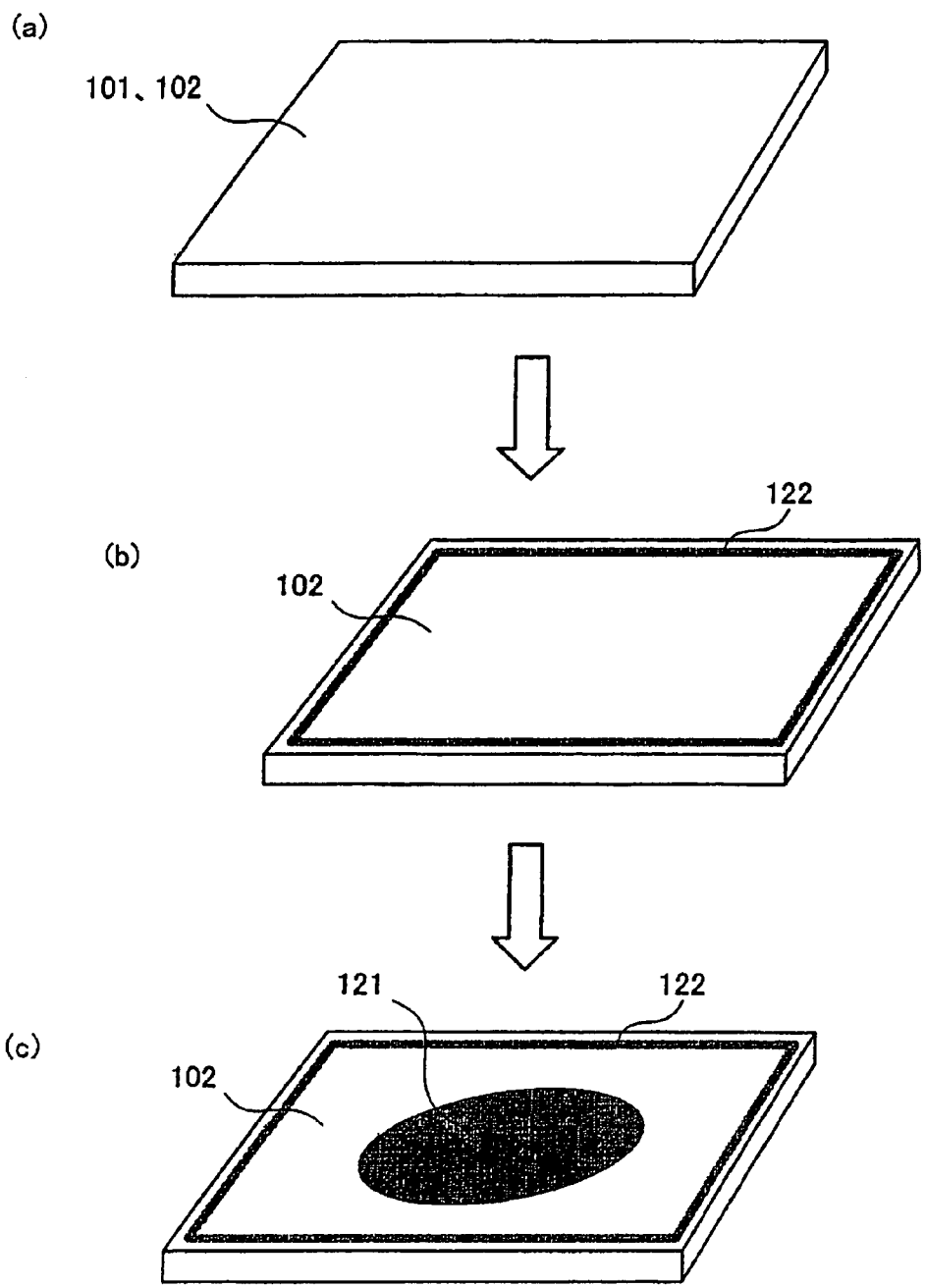
FIGS. 3(a)–3(c) are schematic views showing the steps of manufacturing the liquid crystal display panel.

As shown in FIGS. 2 to 4, the glass substrates 101 and 102 (the color filter substrate and the TFT array substrate) are first manufactured, respectively (Step 201 in FIG. 2 and FIG. 3A). On the manufactured glass substrate 102, a column structure (not shown) functioning as a spacer is formed.

Next, the sealing agent 122 is applied in a frame shape to the periphery of the glass substrate 102 as the TFT array substrate (Step 202 in FIG. 2 and FIG. 3B). As the sealing agent 122, as described above, ultraviolet cure resin and thermosetting resin can be used. Here, the ultraviolet cure resin is assumed to be used.

After the application of the sealing agent 122, the liquid crystal 121 is dropped by a dispenser onto the region on the glass substrate 102, which is surrounded by the sealing agent 122 applied in the frame shape (Step 203 in FIG. 2 and FIG. 3C).

The glass substrate 101, which is the color filter substrate, and the glass substrate 102 are laminated on each other. That is, the glass substrates 101 and 102 are allowed to face each other and set in a supporting device for lamination (a glass substrate supporting device 51 to be described later) (Step 204 in FIG. 2). Then, after positioning of the substrates is conducted (Step 205 in FIG. 2), the substrates are superposed and adhered to each other (Step 206 in FIG. 2 and FIG. 4D). Thereafter, the gap between the glass substrates 101 and 102 is adjusted by application of pressure (Step 207 in FIG. 2). It is needless to say that this lamination of the substrates is realized in the state where the sealing agent 122 and the liquid crystal 121 exist between the both glass substrates 101 and 102.

After the lamination of the glass substrates 101 and 102, curing processing is conducted for the sealing agent 122 (Step 208 in FIG. 2 and FIG. 4E). Specifically, ultraviolet rays are irradiated from a ultraviolet irradiation lamp onto a lamination body of the glass substrates 101 and 102, thereby curing the ultraviolet cure resin used as the sealing agent 122.

In the above-described manufacturing steps, the following steps are executed in the atmosphere. Specifically, executed are the steps of: applying the sealing agent 122 to the glass substrate 102 (Step 202); dropping the liquid crystal 121 onto the glass substrate 102 (Step 203); setting the glass substrates 101 and 102 in the supporting device for lamination (Step 204); and conducting the curing processing for the sealing agent 122 (Steps 208 and 209). However, the step of laminating the glass substrates 101 and 102 (Steps 205 to 207) is executed in a vacuum chamber. This is because entrainment of air bubbles or remnants thereof in the liquid crystal 121 is thereby prevented.

Figure 11:
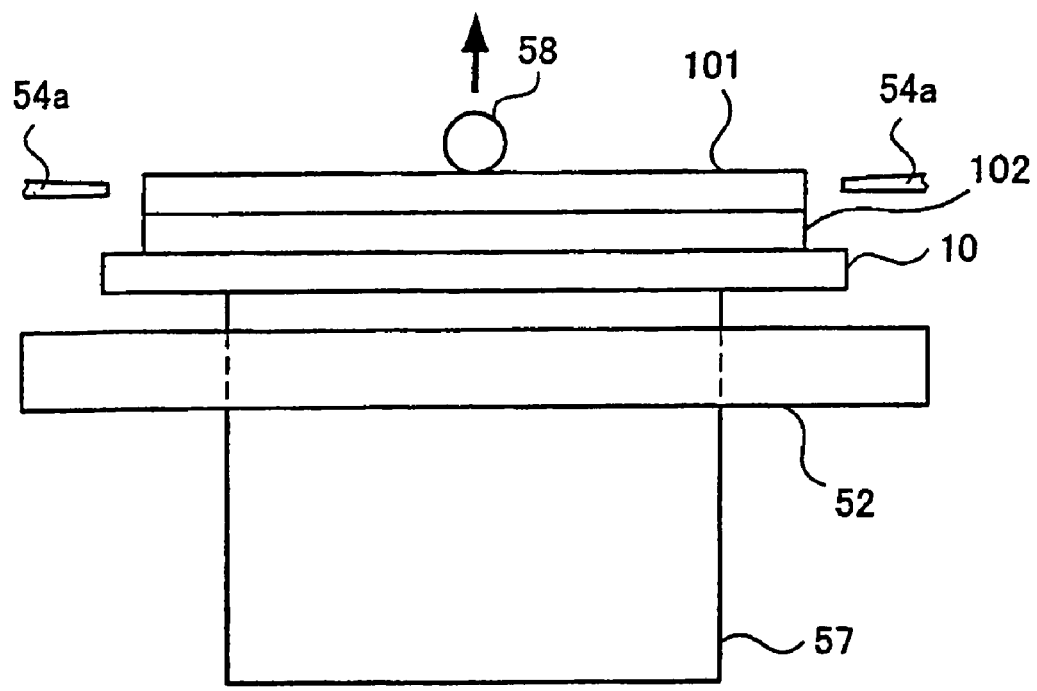
FIG. 11 is a view showing one of the steps of laminating the pair of glass substrates, which shows a state where holding by the supporting claws is released.
Figure 12:
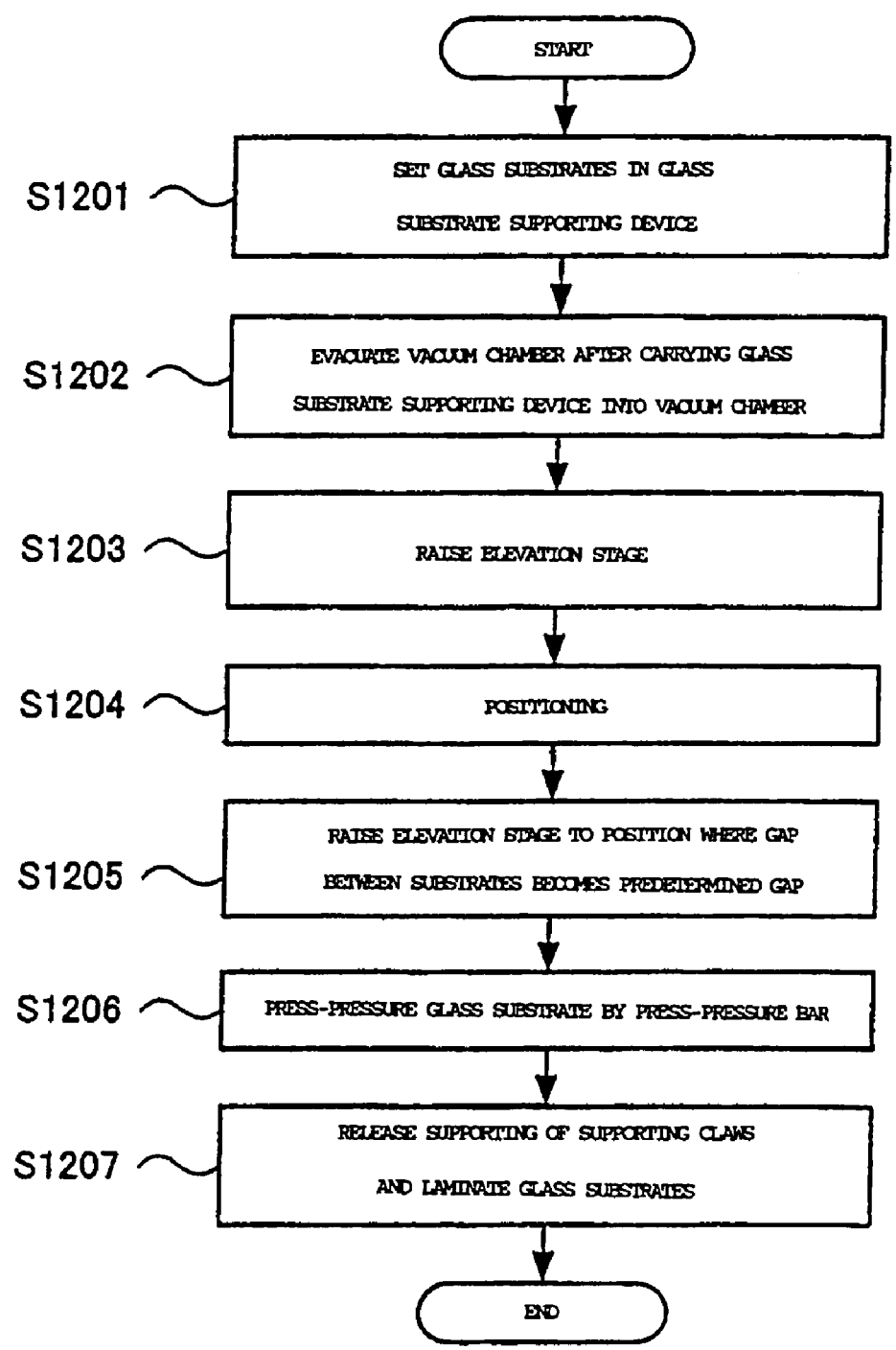
FIG. 12 is a flowchart illustrating the steps of laminating the pair of glass substrates.

Next, with reference to FIGS. 5 to 12, description will be made for the steps of laminating the glass substrates 101 and 102. Note that FIG. 5A is a plan view showing the glass substrate supporting device 51 used for laminating the glass substrates 101 and 102, and FIG. 5B is a sectional view along the line A—A of FIG. 5A. FIGS. 6 to 11 are side views schematically illustrating the steps of laminating, by use of the glass substrate supporting device 51, the glass substrates 101 and 102. In addition, FIG. 12 is a flowchart illustrating the steps of laminating the glass substrates 101 and 102.

As shown in FIGS. 5A and 5B, the glass substrate supporting device 51 has a base 52 having a rectangular setting plane 52a. An aperture window 56 is formed in a center portion of the base 52. An elevation stage 57 to be described later moves up and down within the aperture window 56.

On the base 52, rails 55 are provided, and sliding stages 53a and 53b are placed as movable along the rails 55. The sliding stages 53a can move along long sides of the base 52 and parallel with the setting plane 52a. Meanwhile, the sliding stages 53b can move along short sides of the base 52 and parallel with the setting plane 52a. Although means for moving the sliding stages is not shown in the drawing, publicly known driving means and driving mechanism, such as a motor, can be used. The sliding stages 53a and 53b can move independently of each other, and can properly correspond to supports of the glass substrate 101, which differ in size.

Figure 6:
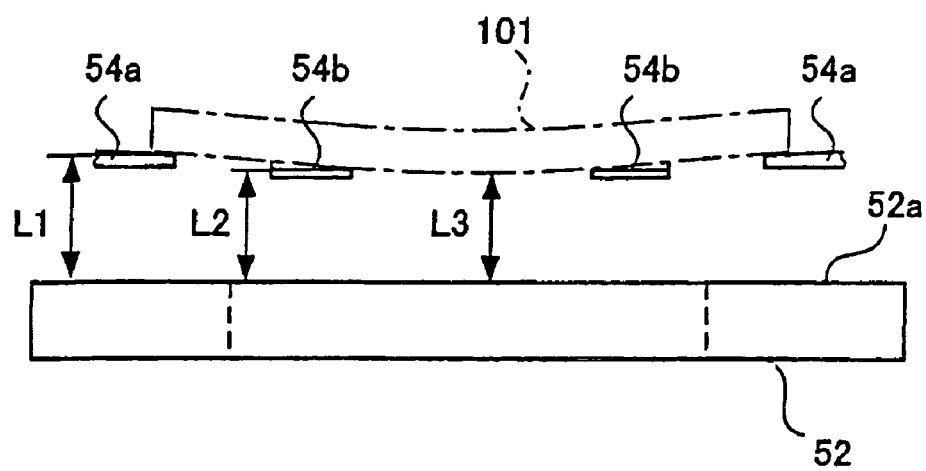
FIG. 6 is a view for explaining positions of supporting claws, in a vertical direction, of the glass substrate supporting device shown in FIG. 5.

To both edges of the respective sliding stages 53a and 53b, supporting claws 54a and 54b are attached. These supporting claws hold the glass substrate 101, and can move together with the sliding stages 53a and 53b in a direction parallel to the setting plane 52a. However, positions of the supporting claws are fixed in a direction perpendicular to the setting plane 52a. Moreover, a distance from the setting plane 52a to the supporting claws 54a is greater than that from the setting plane 52a to the supporting claws 54b. That is, as shown in FIG. 6, assuming that the distance from the setting plane 52a to the supporting claws 54a is L1 and that the distance from the setting plane 52a to the supporting claws 54b is L2, L1 is greater than L2. This implies that the supporting claws 54b support the glass substrate 101 at positions lower than the supporting claws 54a by a predetermined distance.

When the glass substrate 101 is supported by the supporting claws 54a and 54b, the glass substrate 101 bends as shown in FIG. 6. Although a flexure amount reaches its maximum at a center portion of a support span of the glass substrate 101 by the supporting claws 54a, the flexure amount can be controlled at a constant value owing to existence of the supporting claws 54b. This implies that a distance L3 between a lowermost plane of the glass substrate 101, where the flexure occurs, and the setting plane 52a of the base 52 can be controlled to be constant. Even if the glass substrate 101 is changed in size, the distance L3 can be controlled to be constant similarly to the above. In laminating the glass substrates 101 and 102, the glass substrates 101 and 102 are first set in the glass substrate supporting device 51 (Step 1201 in FIG. 12).

Figure 7:
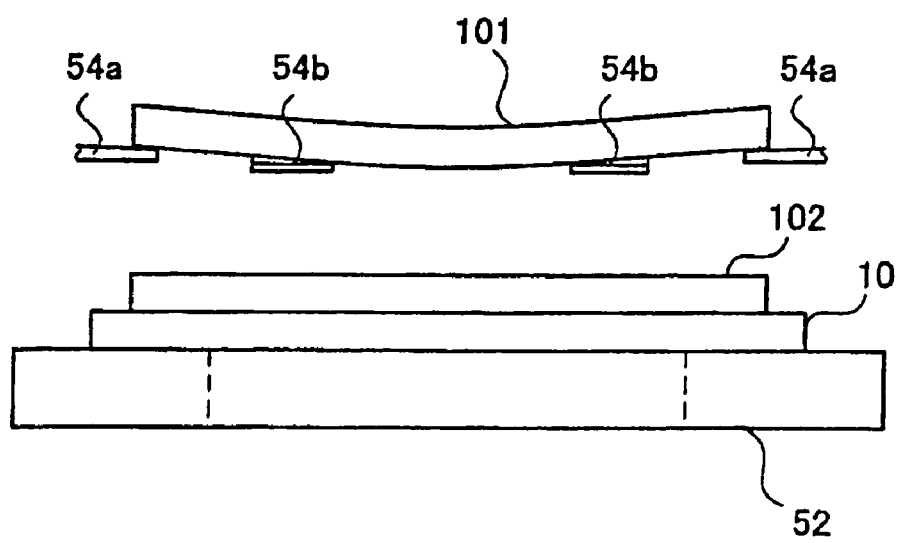
FIG. 7 is a view showing a state where the glass substrate supporting device holds a pair of glass substrates.

FIG. 7 is a view showing a state where the glass substrates 101 and 102 are set in the glass substrate supporting device 51. In FIG. 7, a carrier plate 10 is set on the setting plane 52a of the glass substrate supporting device 51, and one of the substrates, that is, the glass substrate 102 herein is set thereon. As described later, actuators are provided in the carrier plate 10, the actuators being a device for fixing the glass substrate 102. The actuators hold and fix the glass substrate 102 in vacuum.

Note that description for the sealing agent 122 and liquid crystal 121 of the glass substrate 102 is omitted in FIG. 7. In addition, although both of the glass substrates 101 and 102 have rectangular shapes, the other substrate held by the supporting claws 54a and 54b, that is, the glass substrate 101 herein bends along its longitudinal direction. The flexure amount of the glass substrate 101 is determined based on the thickness of the glass substrate 101 and the support span thereof supported by the supporting claws 54a. However, as described above, the supporting claws 54a and 54b are fixed in the direction perpendicular to the setting plane 52a to have a positional relationship therebetween as shown in FIG. 6. Thus, even if the size of the glass substrate 101 is increased or reduced, the flexure amount thereof can be controlled at a constant value.

After the glass substrates 101 and 102 are set as shown in FIG. 7, the glass substrate supporting device 51 is carried to the vacuum chamber (Step 1202 in FIG. 12). In the vacuum chamber, lamination of the glass substrates 101 and 102 is executed. The reason for the execution of lamination in the vacuum chamber is that air bubbles are prevented from remaining in the liquid crystal 121.

Figure 8:
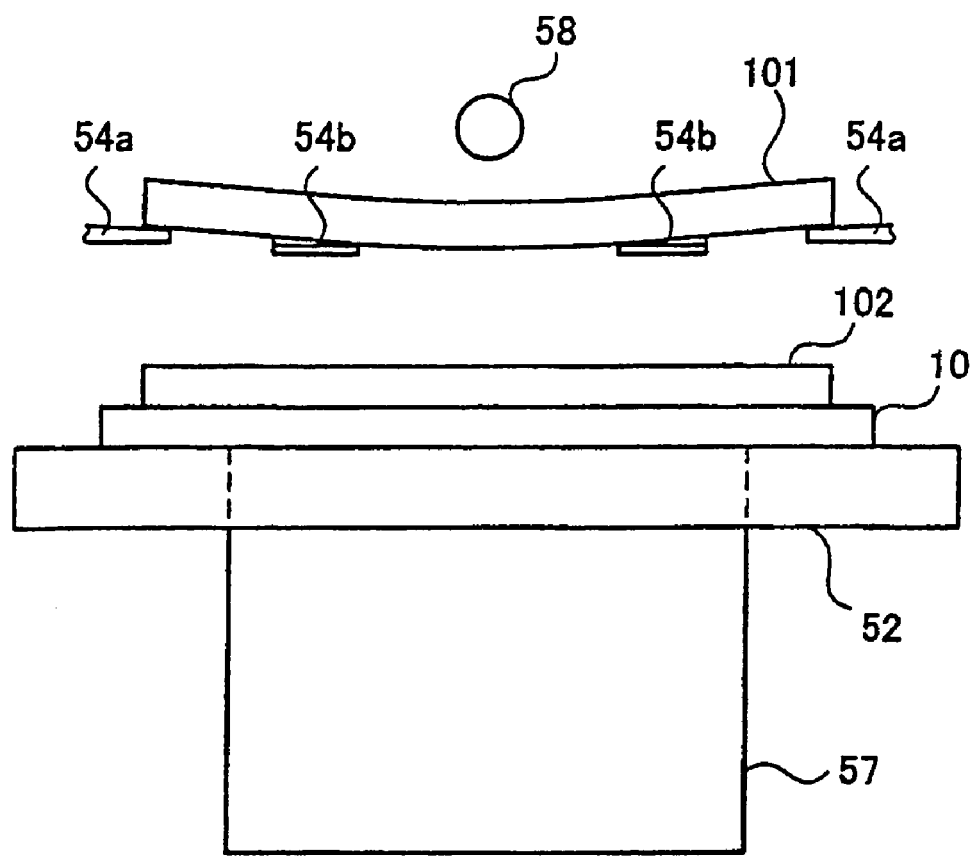
FIG. 8 is a view showing a state where the glass substrate supporting device holding the pair of glass substrates is disposed inside a vacuum chamber.

FIG. 8 shows a state where the glass substrate supporting device 51 is carried into the vacuum chamber. Note that description of the vacuum chamber is omitted in the drawing. In the vacuum chamber, an elevation stage 57 and a press-pressure bar 58 are provided.

The glass substrate supporting device 51 having the glass substrates 101 and 102 set therein is carried to a position of the elevation stage 57 in the vacuum chamber. Furthermore, the glass substrate supporting device 51 is disposed such that a bottom face of the carrier plate 10 comes into contact with a top face of the elevation stage 57. The elevation stage 57 can move up and down by means of a not-shown drive source, and on its top face, a mechanism capable of moving in the X and Y directions indicated by arrows in FIG. 5 is provided. Similarly, the mechanism is also capable of a circular motion in a planar direction indicated by the arrow R in FIG. 5.

Moreover, with reference to FIG. 8, the press-pressure bar 58 is positioned above the glass substrate 101. The press-pressure bar 58 can come into contact with or apart from the glass substrate 101 by not-shown elevating means, and can press-pressure the glass substrate 101 toward the glass substrate 102.

When the glass substrate supporting device 51 is disposed at a predetermined position in the vacuum chamber, the vacuum chamber is evacuated. Although described later in detail, the actuators of the carrier plate 10 surely fix the glass substrate 102 by setting the inside of the vacuum chamber in a vacuum state.

Figure 9:
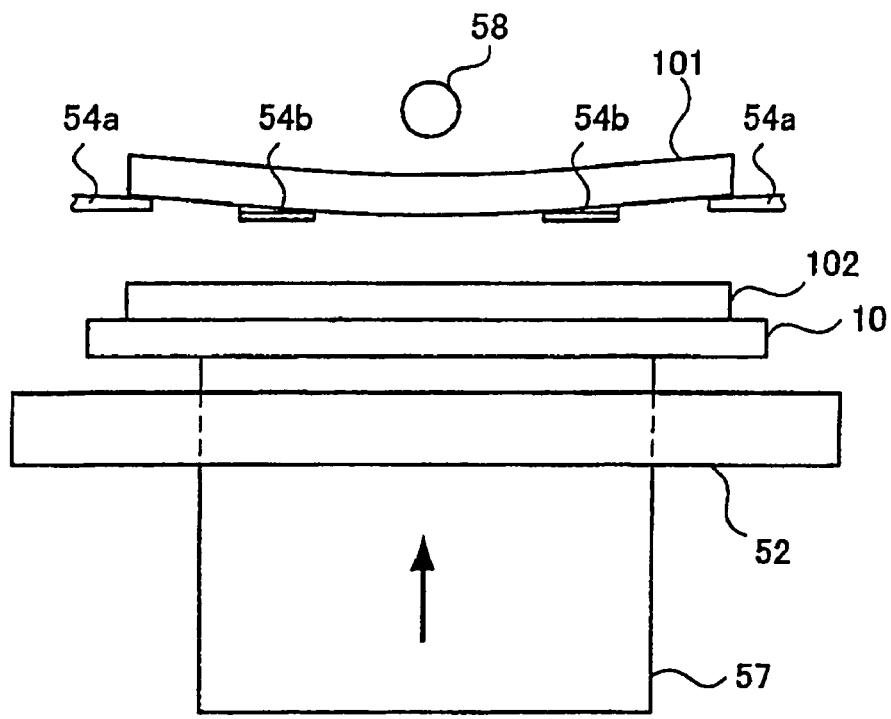
FIG. 9 is a view showing one of the steps of laminating the pair of glass substrates, which shows a state where an ascent of an elevation stage is started.

After the inside of the vacuum chamber reaches a predetermined degree of vacuum, the elevation stage 57 is ascended as shown in FIG. 9 (Step 1203 in FIG. 12). Along with the ascent of the elevation stage 57, the carrier plate 10 and the glass substrate 102 ascend and approach to the glass substrate 101. In this state, by properly moving the top face of the elevation stage 57 in the above-described X, Y and R directions, positioning of the glass substrates 101 and 102 is performed (Step 1204 in FIG. 12). Then, the glass substrate 102 is further ascended by the elevation stage 57, and the movement of the elevation stage 57 is stopped as the gap between the glass substrates 102 and 101 becomes a predetermined value (Step 1205 in FIG. 12).

Figure 10:
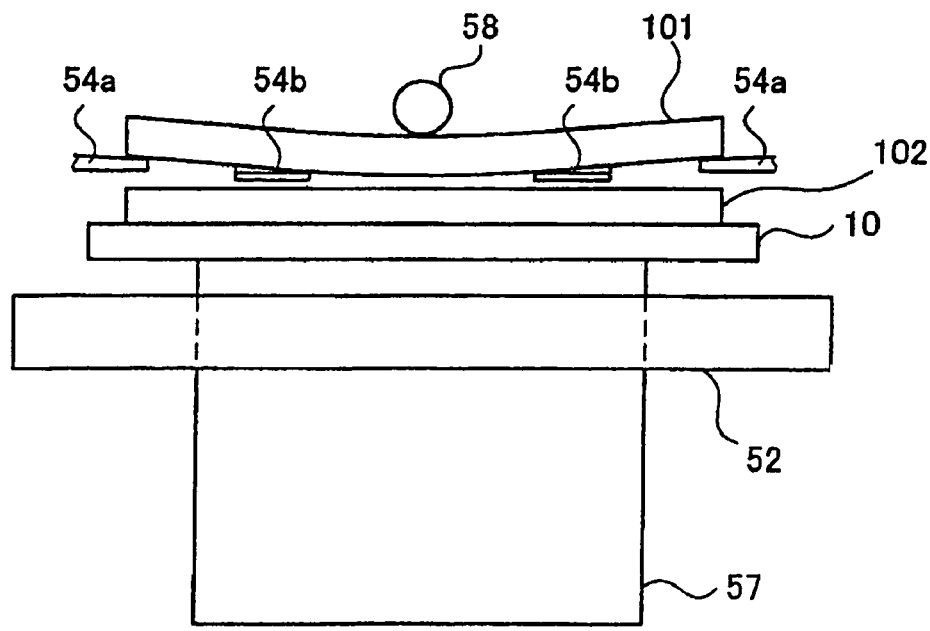
FIG. 10 is a view showing one of the steps of laminating the pair of glass substrates, which shows a state of a descended press-pressure bar after completing the ascent of the elevation stage.

Next, as shown in FIG. 10, the press-pressure bar 58 is descended, and the glass substrate 101 is press-pressured toward the glass substrate 102 (Step 1206 in FIG. 12). Therefore, a load of components in the vertical direction is inflicted on the glass substrate 101. Thus, the flexure amount thereof is increased, and the gap between the glass substrates 102 and 101 is narrowed. Here, it is necessary to control a descending amount of the press-pressure bar 58 so as to allow this narrowed gap to become a cell gap value required for the liquid crystal display panel.

Next, the supporting of the glass substrate 101 by the supporting claws 54b is released, and subsequently, the supporting of the glass substrate 101 by the supporting claws 54a is released (Step 1207 in FIG. 12). When the supporting of the glass substrate 101 by the supporting claws 54a and 54b is released, the glass substrates 101 and 102 are laminated as shown in FIG. 11. Note that description of the gap between the glass substrates 101 and 102 is omitted in FIG. 11.

After completing the lamination of the glass substrates 101 and 102 as described above, the elevation stage 57 is descended, and then the inside of the vacuum chamber is returned to the atmospheric pressure. When the inside of the vacuum chamber is returned to the atmospheric pressure, the fixation of the glass substrate 102 by the actuators of the carrier plate 10 is released. Thus, the laminated glass substrates 101 and 102 fall into a state of being merely set on the carrier plate 10.

Thereafter, the lamination body composed of the glass substrates 101 and 102 is carried from the vacuum chamber together with the glass substrate supporting device 51. Then, the manufacturing process moves to curing processing for the sealing agent 122 by means of the ultraviolet irradiation (see Step 208 in FIG. 2).

Now, conceived is, in the foregoing manufacturing steps, a case where no actuators for fixing the glass substrate 102 exist in the carrier plate 10. Specifically, conceived is a state where the glass substrate 102 is merely set on the carrier plate 10. In setting the glass substrate 102 on the carrier plate 10, a slight amount of air inevitably enters between the carrier plate 10 and the glass substrate 102.

Figure 13:
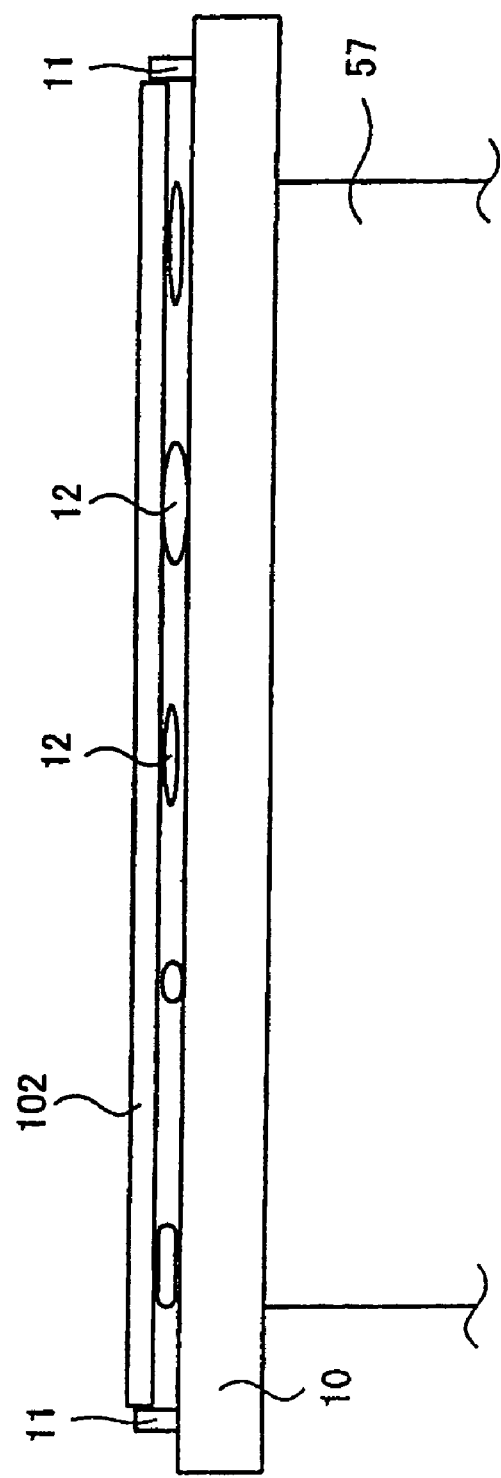
FIG. 13 is a view schematically showing a state where air bubbles remain between a carrier plate and the glass substrate set thereon.

FIG. 13 is a view schematically showing a state where air remains between the carrier plate 10 and the glass substrate 102 set thereon. In the above-described state, it is assumed that the carrier plate 10 and the glass substrate 102 are set in the glass substrate supporting device 51 and that the inside of the vacuum chamber is set in a vacuum state. Then, a slight amount of remnant air 12 existent between the carrier plate 10 and the glass substrate 102 is expanded by reduction of the surrounding pressure. Accordingly, when the elevation stage 57 is moved upon the positioning executed in the Step 1204, the glass substrate 102 makes an inevitable movement attributable to its inertia, which is entirely different from a movement amount of the elevation stage, as if the glass substrate 102 is mounted on an air bearing. In an extreme case, along with deflating of the remnant air 12, the glass substrate 102 moves even passing pins provided, on the carrier plate 10, for preventing the glass substrate 102 from dropping, thereby falling into a state where the positioning is impossible only by the movement of the elevation stage 57.

Moreover, in the press-pressuring of the glass substrate 101 by the press-pressure bar 58 in the Step 1206, a press-pressured portion of the glass substrate 101 and a correspondent portion of the glass substrate 102 are adsorbed to each other because of surface tension and the like of the liquid crystal 121 filled between the glass substrates 101 and 102.

Figure 14:
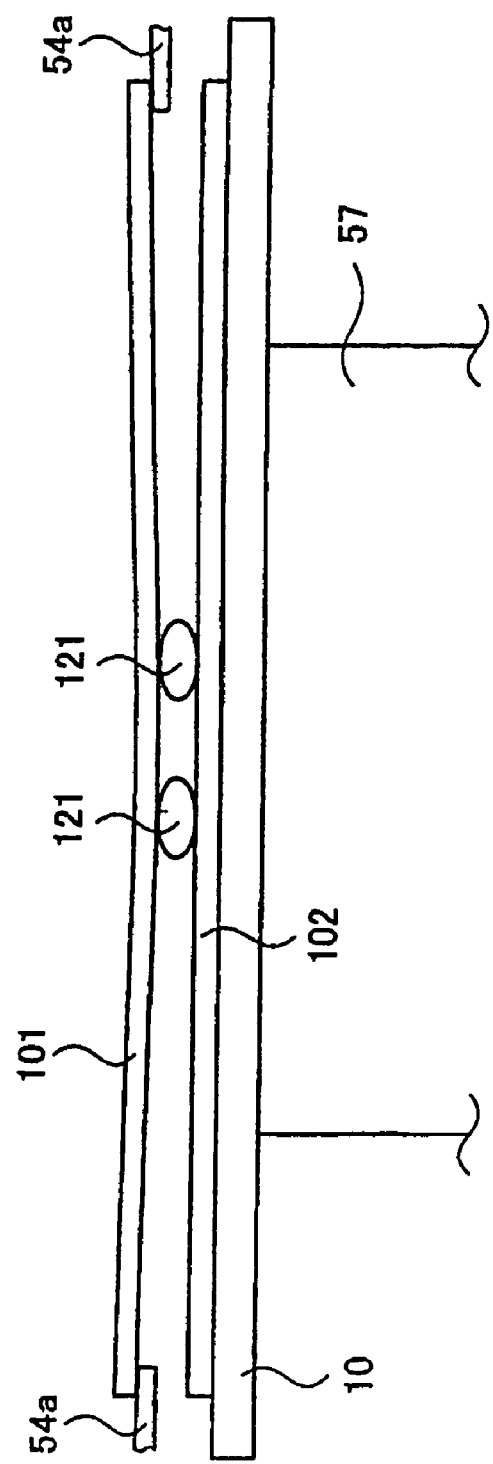
FIG. 14 is a view schematically showing a state of adsorption between the two glass substrates, which is attributable to liquid crystal.

FIG. 14 is a view schematically showing a state of adsorption between the glass substrates 101 and 102 by the liquid crystal 121. When the glass substrates 101 and 102 are attached to each other in this state, the glass substrates 101 and 102 are shifted from their positions at the moment of the attachment thereof, because of the reasons as follows. Specifically, adsorptivity of the liquid crystal 121 is uneven, and the remnant air 12 between the glass substrate 102 and the carrier plate 10 makes the glass substrate 102 prone to move. Consequently, degradation in attachment accuracy of the substrates is inevitably incurred.

For the above reason, means for fixing the glass substrate 102 to the carrier plate 10 becomes necessary. However, the vacuum adsorption incapable of being used in vacuum and the electrostatic adsorption having a risk of breaking electric circuits are not appropriate. Moreover, in consideration of the application thereof such that the means 10 is provided on the carrier plate 10 to fix the glass substrate 102, an elaborate and costly mechanical method of holding the substrate is not preferable, either.

For the purpose of the holding method, which is to fix the glass substrate 102 to the carrier plate 10 in an operation in vacuum, conditions required for the holding means are enumerated as follows:

(1) When the glass substrate 102 is set on or detached from the carrier plate 10, the holding means is released from a fixed state.
(2) In operations of evacuation, positioning and attachment, the holding means falls into a fixed state.
(3) The holding means cannot be fixed or released structurally by any external means, because they are the steps executed in the vacuum chamber.
(4) In order to attach the glass substrates 101 and 102 to each other, the glass substrate 102 cannot be pressed from its top face (the face for attachment), so that the glass substrate 102 is held by being pressed on its four sides. In this case, the thickness of the glass substrate 102 is about 0.7 mm, and in consideration of chamfering thereof, the pressed portion of the glass substrate 102 corresponds to about 0.4 mm of the thickness thereof.

(5) Regarding the size of the carrier plate 10 for providing the fixation means, the length of four sides thereof is approximately obtained by adding 2 mm to the length of the four sides of the glass substrate 102, and the width thereof is about 4 mm.

(6) It is necessary to suppress generation of dust as much as possible.

By taking the above-described conditions into account, in the embodiment, used is an actuator using an airbag with the air (or other optional gas) sealed therein, and operating by means of an expansion force of the airbag as power in the vacuum state of the vacuum chamber, thereby fixing the glass substrate 102.

Figure 15:
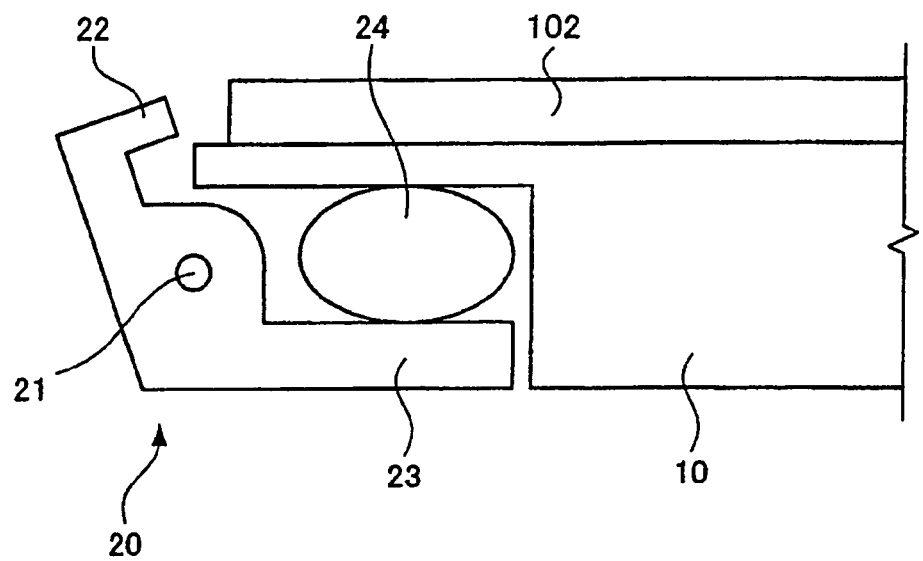
FIG. 15 is a view explaining a structure of an actuator according to an embodiment, which shows a state of releasing fixation of the glass substrate.
Figure 16:
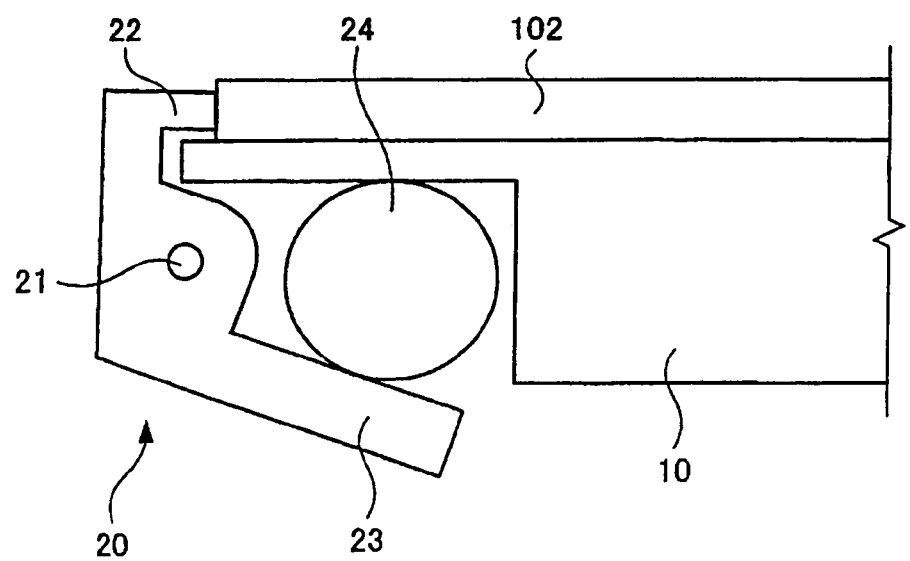
FIG. 16 is a view explaining the structure of the actuator according to the embodiment, which shows a state of fixing the glass substrate.

FIGS. 15 and 16 are views respectively explaining a structure of the actuator according to the embodiment: FIG. 15 shows a state of releasing fixation of the glass substrate 102; and FIG. 16 shows a state of fixing the glass substrate 102. As shown in FIGS. 15 and 16, an actuator 20 of the embodiment includes: an axis 21 provided in the periphery of the carrier plate 10; a claw 22 and an arm 23 which are provided as freely rotatable in the periphery of the axis 21; and an airbag 24 as a power source.

The airbag 24 is held by the arm 23 and the carrier plate 10. When the airbag 24 expands, the arm 23 receives movement caused by this expansion and rotates the claw 22 by use of a lever taking the axis 21 as a fulcrum. Accordingly, the claw 22 is abutted on the edge of the glass substrate 102.

Figure 17:
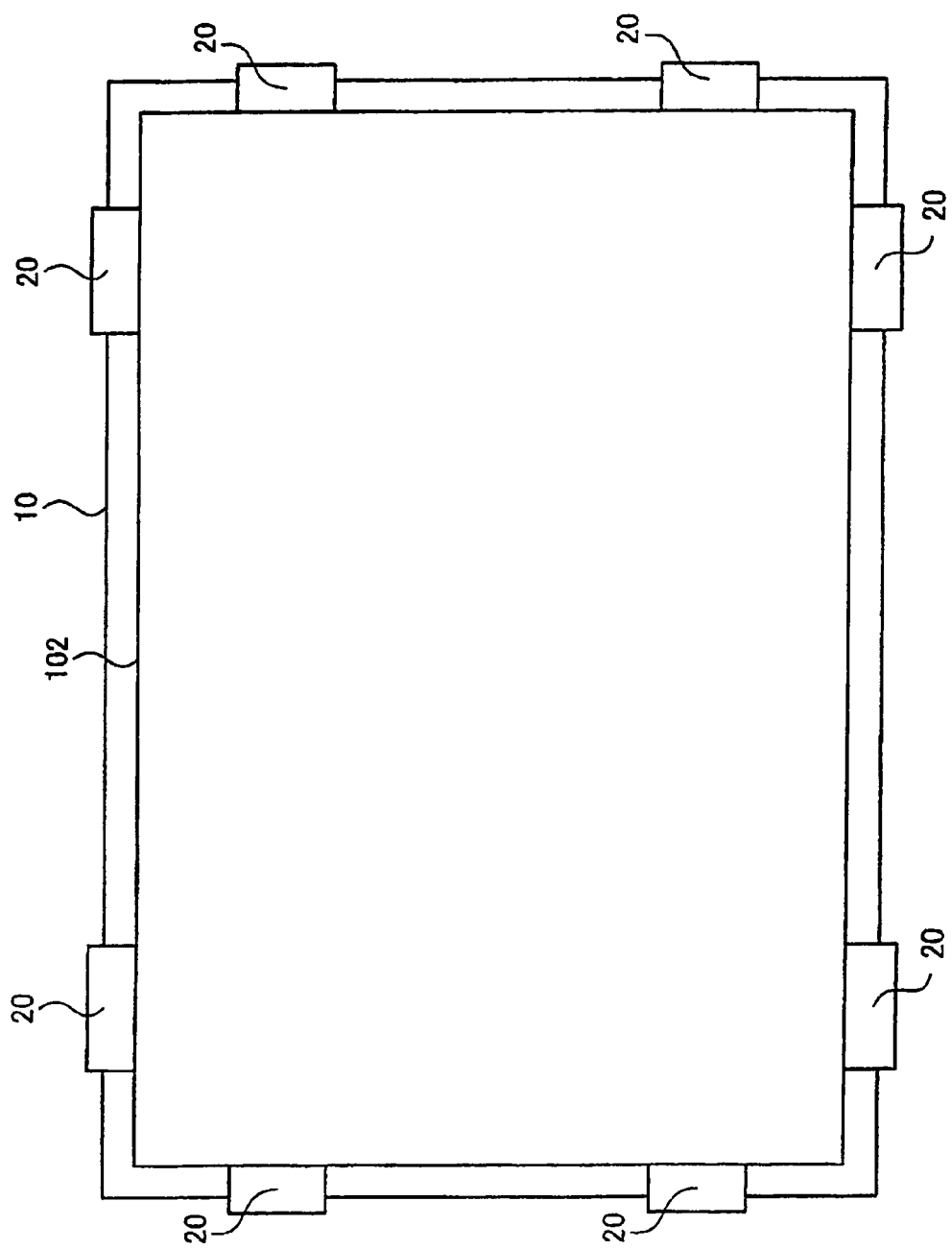
FIG. 17 is a view showing a state where the actuators shown in FIGS. 15 and 16 are placed on the carrier plate.

FIG. 17 is a view showing a state where the actuators shown in FIGS. 15 and 16 are placed on the carrier plate 10. As shown in the drawing, the actuators 20 are provided on the four sides of the carrier plate 10, and the airbag 24 is expanded in the state of setting the glass substrate 102 on the carrier plate 10. Thus, the claws 22 press the four sides of the glass substrate 102 inwardly from the periphery thereof, thereby holding the entire glass substrate 102.

Note that the carrier plate 10 is a setting stage for supporting the glass substrate 102 or a panel (liquid crystal display panel) composed of the lamination of the glass substrates 101 and 102 so as not to bend the glass substrate 102 or the panel in operation or carrying thereof. The carrier plate 10 normally constitutes a rectangular shape larger than the glass substrate 102 by about 2 mm per side. Therefore, as shown in the drawing, the carrier plate 10 resultantly fixes the glass substrate 102 set thereon by provision of the actuators 20 on the four sides thereof. However, the relationship between the carrier plate 10 and the glass substrate 102 in size and shape is not limited to the foregoing. Positions for placing the actuators 20 also need to be determined appropriately so as to surely fix the glass substrate 102 in the state of setting the glass substrate 102 on the carrier plate 10.

In addition, as shown in FIG. 16, the arm 23 is provided so as to protrude a lower face (a) of the carrier plate 10 when the claw 22 abuts on the glass substrate 102. Accordingly, when the carrier plate 10 is set on the setting plane 52*a* of the base 52 of the glass substrate supporting device 51, the arm 23 of the actuator 20 is pushed up under the weight of the carrier plate 10 itself. Thus, as shown in FIG. 15, the claw 22 draws away from the glass substrate 102, and the fixation of the substrate is thereby released.

Note that such a mechanism for releasing the fixation is not more than an example. It is also possible to provide dynamic means for rotating the actuator 20 by using an elastic force of a spring in a direction where the claw 22 draws away from the glass substrate 102. However, since the claw 22 is rotated in response to the expansion of the airbag 24, thereby fixing the glass substrate 102, the above-described dynamic means has to be one for operating the actuator 20 by a force smaller than an expansive force of the airbag 24.

Since the air is sealed in the airbag 24, the airbag 24 performs expansion/contraction thereof by the air pressure difference between the inside and outside of the airbag 24. Thus, by properly adjusting the air pressure inside the airbag 24, the airbag 24 contracts in the atmospheric pressure, and thus the claw 22 opens under the weight of the carrier plate 10 itself as described above, and the fixation of the glass substrate 102 is released. Meanwhile, when the glass substrate supporting device 51 having the carrier plate 10 set therein is set in the vacuum state in the vacuum chamber, the airbag 24 expands and the claw 22 automatically closes, thereby fixing the glass substrate 102.

As described above, the airbag 24 is subjected to the expansion/contraction, and thus the glass substrate 102 is fixed and released. Accordingly, the airbag 24 needs its expansive force adjusted by properly setting its material, size, internal pressure and the like. In the embodiment, the airbag 24 of a cylindrical shape is obtained by sealing both ends of a tube formed of silicon rubber with an adhesive made of the same silicon rubber. In addition, regarding the size of the tube, the tube has a length of 7 mm, an outside diameter of 4 mm and an inside diameter of 2.7 mm. In a state of crushing the tube so as to set a short diameter (outside diameter) as 2.5 mm, the both ends of the tube are sealed in the atmospheric pressure (under 1 atm.). Accordingly, in the atmospheric pressure, the airbag 24 is in the state of being crushed to some extent, and the claw 22 falls into the state of being apt to open.

Note that the shape, material and dimensions described above are not more than an example, the airbag 24 may take any constitution as long as the airbag 24 can generate a proper expansive force. For example, the airbag 24 may have a spherical shape instead of the cylindrical shape, and fluorine rubber may be used instead of the silicon rubber. Moreover, it is needless to say that the size of the carrier plate 10 and the kind of the object to be held need to be properly selected according to an environment in which the actuator 20 is used.

Figure 18:
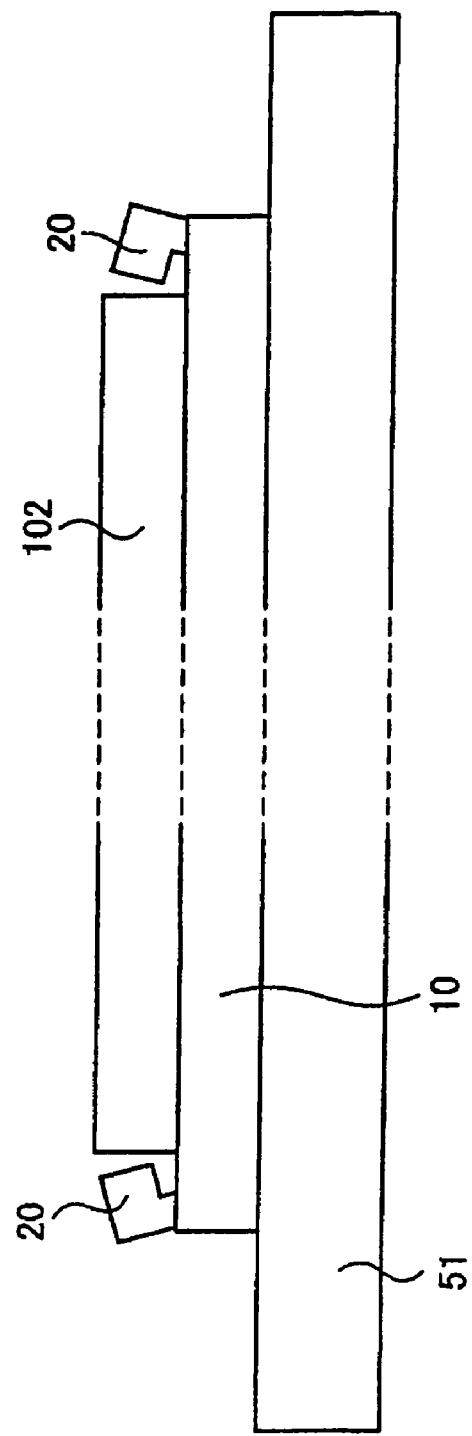
FIG. 18 is a view explaining an operation of the actuator in the steps of laminating the glass substrates, which shows a state of releasing claws of the actuator.
Figure 19:
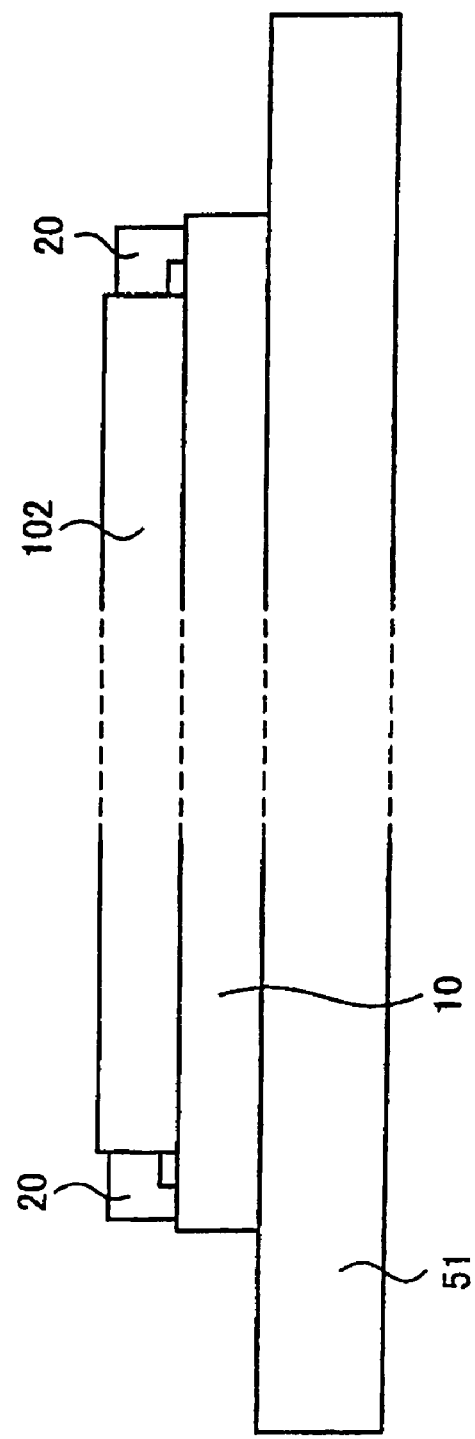
FIG. 19 is a view explaining an operation of the actuator in the steps of laminating the glass substrates, which shows a state of locking claws of the actuator.

FIGS. 18 and 19 are views explaining an operation of the above-described actuator 20 in the steps of laminating the glass substrates 101 and 102, which are described with reference to FIGS. 5 to 12. In the state where the carrier plate 10 is set on the base 52 of the glass substrate supporting device 51 in the atmospheric pressure, as shown in FIG. 18, the airbag 24 is contracted, the arm 23 is pushed up under the weight of the carrier plate 10 itself and thus the claw 22 is made open.

Meanwhile, in the operation inside the vacuum chamber, the inside of the vacuum chamber falls into the vacuum state, and the internal pressure of the airbag 24 is relatively increased. Thus, the airbag 24 expands and pushes up the arm 23. Moreover, due to the ascent of the elevation stage 57 (see Step 1203 in FIG. 12), as shown in FIG. 19, the peripheral portion of the carrier plate 10 floats, thereby generating no force of pushing up the arm 23. Therefore, the claw 22 is closed, thus firmly fixing the glass substrate 102. The attachment of the glass substrates 101 and 102 (Step 1207 in FIG. 12) performed in this state eliminates the risk of degraded attachment accuracy due to the movement of the glass substrate 102.

Furthermore, since the glass substrate 101 is firmly fixed onto the carrier plate 10, the positioning (contact alignment) of the glass substrates 101 and 102 can be conducted by operating the elevation stage 57 having the glass substrate 102 mounted thereon. Specifically, the above positioning can be conducted even in the state where, due to the press-pressuring of the glass substrate 101 by the press-pressure bar 58 in the Step 1206 in FIG. 12, the glass substrates 101 and 102 partially approach to each other and are adsorbed to each other by the liquid crystal 122.

Therefore, in the operation from the Step 1203 to the Step 1206, although the press-pressure bar 58 is lowered after conducting the positioning of the glass substrates 101 and 102, it is also possible to first lower the press-pressure bar 58 until the gap between the glass substrates 101 and 102 approaches the cell gap value and then to conduct the positioning of the glass substrates 101 and 102.

As described above, in the embodiment, the glass substrate 102 is fixed onto the carrier plate 10 by use of the actuator 20 provided on the carrier plate 10. Accordingly, the glass substrate 102 set on the carrier plate 10 falls into a state of being floated by the air remaining between the carrier plate 10 and the glass substrate 102 in the vacuum state. Thus, it is made possible to prevent the glass substrate 102 from moving.

In the foregoing embodiment, description was made for the case, as an example, where the glass substrate 102 is fixed onto the carrier plate 10 in the supporting device for supporting the glass substrates 101 and 102 by the mechanical method. However, the glass substrate supporting device 51 itself is not limited to the one having the constitution shown in the foregoing embodiment. When the operation can be performed in the vacuum state, it is needless to say that the fixation of the glass substrate 102 by use of the actuator 20 according to the embodiment can be conducted in the supporting device using the electrostatic adsorption or in the supporting device using the vacuum adsorption for performing adsorption at a degree of vacuum much higher than that inside the vacuum chamber.

Moreover, according to the foregoing embodiment, in the steps of manufacturing the liquid crystal display panel, the actuator 20 is used for fixing the glass substrate 102. However, the object to be fixed is not limited to the glass substrate 102. For example, when an operation in vacuum is required in steps of manufacturing a semiconductor, the actuator 20 may be used for fixing a circuit board. Besides the above, the actuator 20 can be widely utilized when various substrates need to be pressed by being sandwiched from both sides thereof in the operation in vacuum.

Furthermore, the actuator 20 uses the expansion/contraction of the airbag 24 as power as described above. However, the expansion/contraction itself of the airbag 24 may be the one caused by a temperature difference, besides the one accompanied by variations in air pressure as described above. In other words, the actuator 20 can be operated by making use of behaviors of the airbag 24 as follows: the airbag 24 contracts when a volume of the air inside the airbag 24 is reduced at a low temperature; the airbag 24 expands when the volume of the air inside the airbag 24 is increased at a high temperature.

Moreover, in the above-described embodiment, the expansion/contraction of the airbag 24 is converted into an open/close operation of the claw 22 by use of the lever, and thus the glass substrate 102 is fixed. However, it is satisfactory that the actuator 20 is the one capable of fixing the glass substrate 102 by using the expansion/contraction of the airbag 24 as power. Accordingly, the actuator 20 does not necessarily have the constitution using the lever as described in FIGS. 15 and 16. For example, the glass substrate 102 may be pressed by directly press-pressuring the claw 22 in response to the expansion of the airbag 24, instead of rotating the claw 22 around the axis 21.

Moreover, in the foregoing embodiment, the glass substrate 102 is fixed by expanding the airbag 24 to close the claw 22. In other words, the constitution is employed where the substrate is fixed in vacuum and released in the atmospheric pressure. However, depending on contents of the operation conducted in vacuum, conceivable is a case where it is required to fix the substrate in the atmospheric pressure and to release the same in vacuum. In this case, it is necessary to have such a constitution in which the claw 22 of the actuator 20 is released in response to the expansion of the airbag 24.

Figure 20:
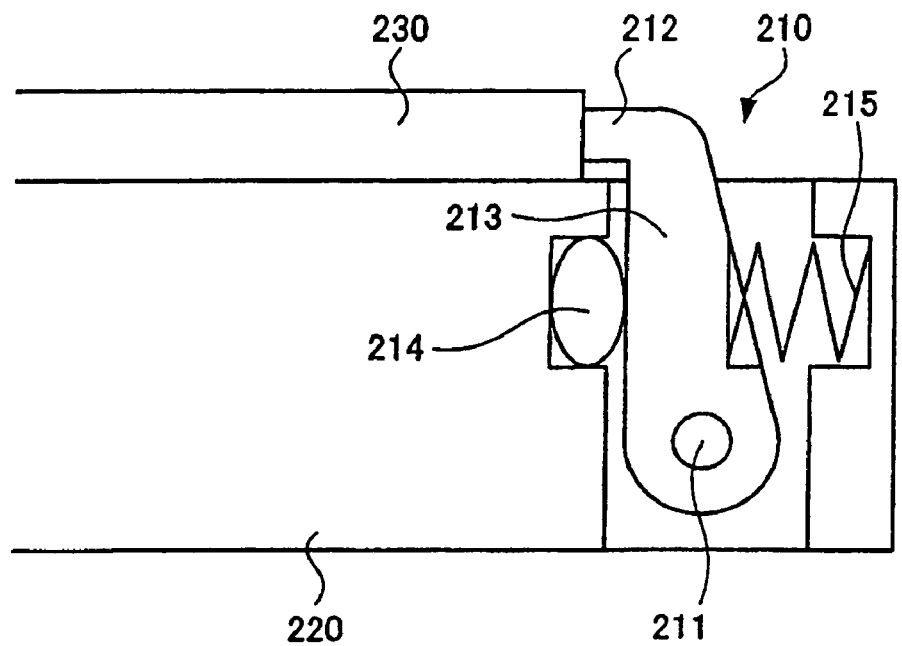
FIG. 20 is a view explaining a structure of an actuator releasing a substrate by expansion of an airbag, which shows a state of fixing the glass substrate.
Figure 21:
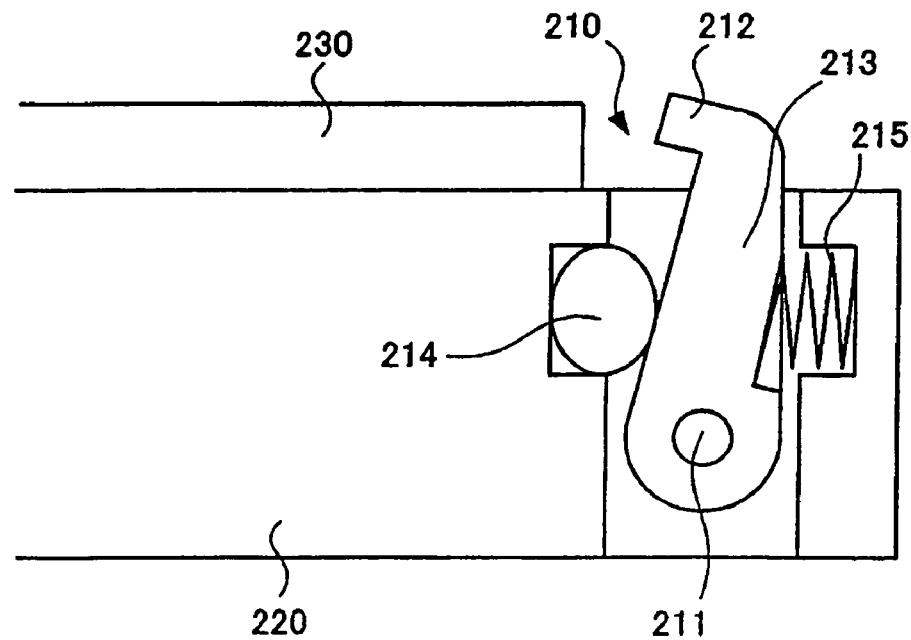
FIG. 21 is a view explaining a structure of an actuator releasing a substrate by expansion of an airbag, which shows a state of releasing the fixation of the glass substrate.

FIGS. 20 and 21 are views explaining a structure of an actuator releasing a substrate by expansion of an airbag: FIG. 20 shows a state of fixing the substrate; FIG. 21 shows a state of releasing the fixation of the substrate. As shown in FIGS. 20 and 21, this actuator 210 includes: an axis 211 provided in the periphery of a setting stage 220 equivalent to the carrier plate 10; a claw 212 and an arm 213 which are provided as freely rotatable around the axis 211; an airbag 214 as a power source; and a spring 215 for pressing the arm 213 toward a direction of closing the claw 212.

The state of the actuator 210, which is shown in FIG. 20, is a state thereof in the atmospheric pressure. Since the airbag 214 is contracted, the arm 213 cannot oppose an elastic force of the spring 215, and thus the claw 212 is closed to abut on and fix a substrate 230. Meanwhile, the state of the actuator 210, which is shown in FIG. 21, is a state thereof in vacuum. The expansion of the airbag 214 opposes the spring 215 and pushes back the arm 213, whereby the claw 212 draws away from the substrate 230, and the fixation of the substrate 230 is released.

Note that, according to the constitution of the actuator 210 shown in FIGS. 20 and 21, the opening/closing of the claw 212 is performed by the rotation of the arm 213 around the axis 211. However, the above constitution of the actuator 210 is not more than an exemplification thereof. For example, the fixing/releasing of the substrate 230 is possible by having a constitution as follows. Specifically, a limitation is set on the movement of the claw 212 by providing guiding means such as a rail as appropriate, instead of providing the axis 211. At the same time, the claw 212 is operated by the expansion/contraction of the airbag 214 and by the elastic force of the spring 215.

Moreover, the spring 215 is merely the means for closing the claw 212 in the contraction of the airbag 214. Thus, the spring 215 is not limited to the mode thereof described in the drawing. For example, a hook may be provided on the arm 213 to lock the spring 215, thereby pulling the arm 213 toward the airbag 214 (direction of closing the claw 212). Furthermore, it is also possible to use a proper elastic member other than the spring 215. As described above, according to the present invention, it is possible to provide holding means capable of surely fixing and positioning a sheet-like substrate even in vacuum, and to provide an operational mechanism thereof.

Moreover, by use of an apparatus for manufacturing a liquid crystal display panel using such holding means and operational mechanism thereof, a liquid crystal display panel in which substrates are accurately laminated by adopting the dropping method can be obtained.

Although the preferred embodiments of the present invention have been described in detail, it should be understood that various changes, substitutions and alternations can be made therein without departing from spirit and scope of the inventions as defined by the appended claims.

What is claimed is:

1. An apparatus for manufacturing a liquid crystal display panel in which liquid crystal is sealed between a pair of substrates disposed opposite each other, comprising:
   a supporting device for supporting one of the substrates;
   a setting stage for setting the other substrate;
   a vacuum chamber for executing, in vacuum, an operation of attaching the one of the substrates to the other substrate onto which the liquid crystal is dropped; wherein the setting stage includes:
   an axis provided at a position on the setting stage along a periphery of the other substrate upon setting the other substrate;
   a claw provided around the axis as freely rotatable, the claw abutting the periphery of the other substrate from a side thereof;
   an arm for operating the claw by means of a lever taking the axis as a fulcrum;
   an airbag provided so as to abut the arm in an expansion, the airbag having air sealed therein; wherein
   when the vacuum chamber is evacuated, the airbag is expanded, the claw is rotated by the arm, and thus the other substrate is fixed by the claw.

2. A method of manufacturing a liquid crystal display panel in which liquid crystal is sealed between a pair of substrates disposed opposite each other, comprising:
   setting one of the substrates on a setting stage having a claw which is opened and closed by using expansion and contraction of an airbag as power, the airbag having air sealed therein;
   dropping liquid crystal on the one of the substrates;
   expanding the airbag by evacuating air surrounding the setting stage on which the one of the substrates is set and sandwiching the one of the substrates from a periphery thereof by closing the claw, thereby fixing the one of the substrates; and
   superposing, under a vacuum environment, the other substrate out of the pair of substrates on the one of the substrates onto which the liquid crystal is dropped and thereby attaching the pair of substrates to each other.

* * * * *